United States Patent
Owyang et al.

[19]

[11] Patent Number: 6,060,375
[45] Date of Patent: May 9, 2000

[54] PROCESS FOR FORMING RE-ENTRANT GEOMETRY FOR GATE ELECTRODE OF INTEGRATED CIRCUIT STRUCTURE

[75] Inventors: Jon Owyang; Sheldon Aronowitz; James P. Kimball, all of San Jose, Calif.

[73] Assignee: LSI Logic Corporation, Milpitas, Calif.

[21] Appl. No.: 08/690,577

[22] Filed: Jul. 31, 1996

[51] Int. Cl.[7] .......................... H01L 21/302; H01L 21/425
[52] U.S. Cl. ........................ 438/585; 438/659; 438/673; 438/739
[58] Field of Search ..................................... 438/585, 657, 438/659, 673, 719, 739, 302, 735, 741

[56] References Cited

U.S. PATENT DOCUMENTS

| | | | |
|---|---|---|---|
| 4,128,845 | 12/1978 | Sakai ........................................ | 257/588 |
| 4,561,907 | 12/1985 | Raicu ....................................... | 438/301 |
| 4,718,976 | 1/1988 | Abraham et al. ........................ | 438/585 |
| 5,156,994 | 10/1992 | Moslehi ................................... | 438/647 |
| 5,252,506 | 10/1993 | Carter et al. ............................. | 438/454 |
| 5,705,405 | 1/1998 | Cunningham ........................... | 438/157 |

*Primary Examiner*—John F. Niebling
*Assistant Examiner*—Ha Tran Nguyen
*Attorney, Agent, or Firm*—John P. Taylor

[57] ABSTRACT

A crystalline semiconductor gate electrode having a re-entrant geometry and a process for making same are disclosed. The novel gate electrode may be formed from a polysilicon layer on a substrate by first implanting a masked polysilicon layer with a neutral species, i.e., a species which will not introduce a dopant into the polysilicon, such as a Group IV element, e.g., silicon, or a Group VIII element, e.g., argon. The neutral species is implanted into the masked polysilicon layer at an angle to provide a tapered implanted region which undercuts one side of the length (long dimension) of the mask. The substrate may then be rotated 180° and then again implanted to provide a tapered implanted region which undercuts the opposite side of the length of the mask. When gate electrodes with such re-entrant geometry are to be formed on a substrate with their long axes at right angles to one another, i.e., some lying along an X axis in the plane of the masked polysilicon layer on the substrate and others lying along a Y axis in the plane of the masked polysilicon layer on the substrate, the substrate may be rotated 90°, rather than 180°, between each implantation, and four implantations, rather than two, are performed. After the implantations, the implanted masked polysilicon layer is then subject to an etch, preferably an anisotropic etch, which will remove the unmasked implanted portions of the polysilicon layer, as well as the implanted regions beneath the mask, resulting in a gate electrode with re-entrant or tapered sidewalls, i.e., resembling an inverted trapezoid in cross-section.

13 Claims, 3 Drawing Sheets

PROCESS FOR FORMING RE-ENTRANT GEOMETRY FOR GATE ELECTRODE OF INTEGRATED CIRCUIT STRUCTURE

BACKGROUND OF THE INVENTION

1. Field of the Invention

This invention relates to re-entrant geometry gate electrodes for integrated circuit structures and the formation of same. More particularly this invention relates to re-entrant geometry gate electrodes formed by selective implantation of a semiconductor material prior to etching the semiconductor material to form the re-entrant gate electrode structure.

2. Description of the Related Art

Implantation of atoms, such as, for example a dopant, into a crystalline structure, such as a single crystal silicon substrate or an epitaxial layer, or a polycrystalline structure such as polysilicon, disrupts the crystalline structure of the material being implanted. The local level of damage to the crystalline structure continues to increase during the implantation until destruction or disappearance of local order is completes, i.e., all crystallinity is gone and an amorphous state, e.g., of silicon, exists in that implanted region of the structure. Normally the disrupted crystalline structure is then subjected to an anneal which restores the crystalline structure to its previous form, i.e., remedies the damage done to the particular crystalline structure.

However, if the damaged crystalline structure is etched after such an implantation, without an intervening anneal step, the etching step is found to be non-uniform, with the portion of the crystalline structure damaged by the previous implantation step responding to the etch treatment at an accelerated rate, i.e., the damaged portion of the crystalline structure etches at a faster rate. This exhibited selectivity is believed to be because many of the atomic bonds have been broken during the implantation in the implanted region of the substrate, thus allowing bonding to plasma species to occur more readily than in regions where, for example, the silicon—silicon bonds first must be broken before additional reaction occurs. Normally this is not a desirable feature and is avoided by first annealing the damaged structure prior to the etching step.

SUMMARY OF THE INVENTION

Quite surprisingly, however, we have discovered that this etch selectivity is useful in the construction of a gate electrode having a re-entrant geometry. In accordance with the invention, a gate electrode having a re-entrant geometry may be formed from a polysilicon layer on a substrate by first implanting a masked polysilicon layer with a neutral species, i.e., a species which will not introduce a dopant into the polysilicon, such as a Group IV element, e.g., silicon, or a Group VIII element, e.g., argon. The neutral species is implanted into the masked polysilicon layer at an angle to provide a tapered implanted region which undercuts one side of the length (long dimension) of the gate electrode mask. The substrate is then rotated 180° and then again implanted to provide a tapered implanted region which undercuts the opposite side of the length of the gate electrode mask. When gate electrodes with such re-entrant geometry are to be formed on a substrate with their long axes at right angles to one another, i.e., some lying along an X axis in the plane of the substrate and others lying along a Y axis in the plane of the substrate, the substrate may be rotated 90°, rather than 180°, between each implantation, and four implantations, rather than two, are performed. After the implantations, the implanted polysilicon layer is then subject to an etch, preferably an anisotropic etch, which will remove the unmasked implanted portions of the polysilicon layer, as well as the implanted regions beneath the mask, resulting in a gate electrode with re-entrant or tapered sidewalls, i.e., resembling an inverted trapezoid in cross-section.

DETAILED DESCRIPTION OF THE INVENTION

Figure 1:
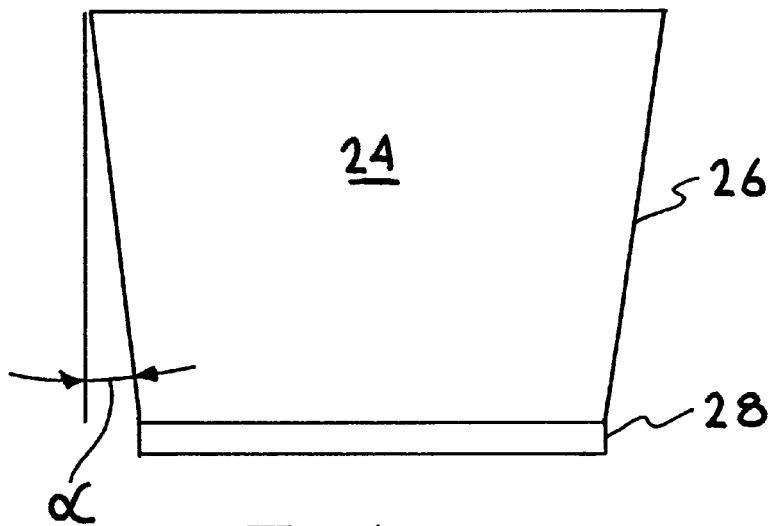
FIG. 1 is a vertical side section view of the re-entrant gate electrode of the invention shown with the underlying gate oxide to provide orientation of the direction of the tapered sidewalls of the re-entrant gate electrode.
Figure 2:
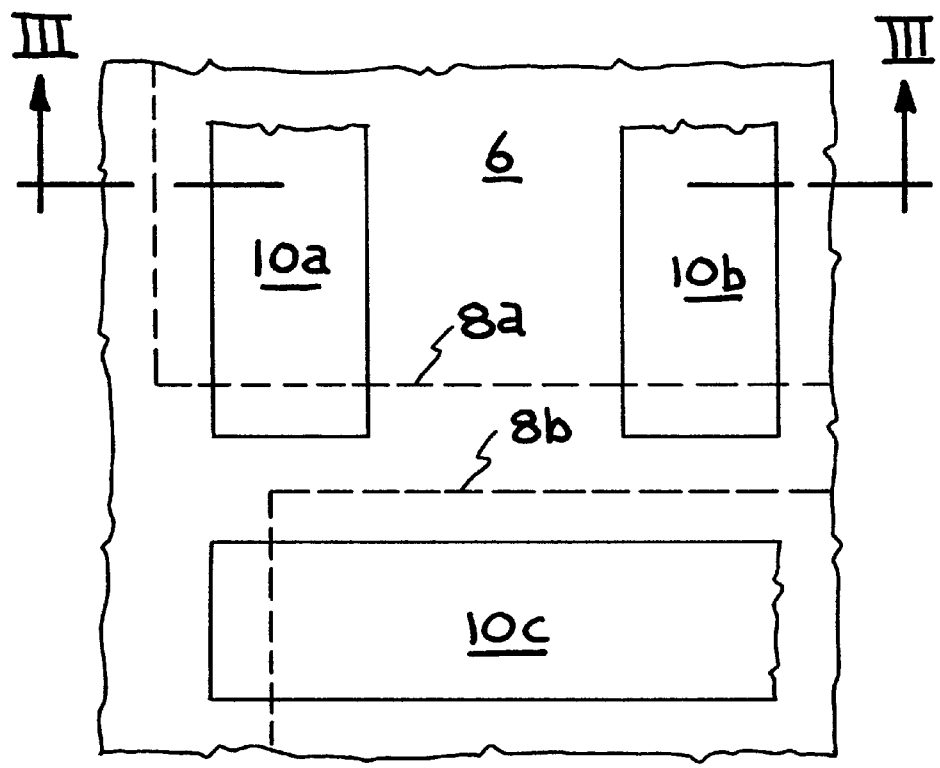
FIG. 2 is a fragmentary top view of a semiconductor substrate having a polysilicon layer thereon and gate electrode masks formed over the polysilicon layer.
Figure 3:
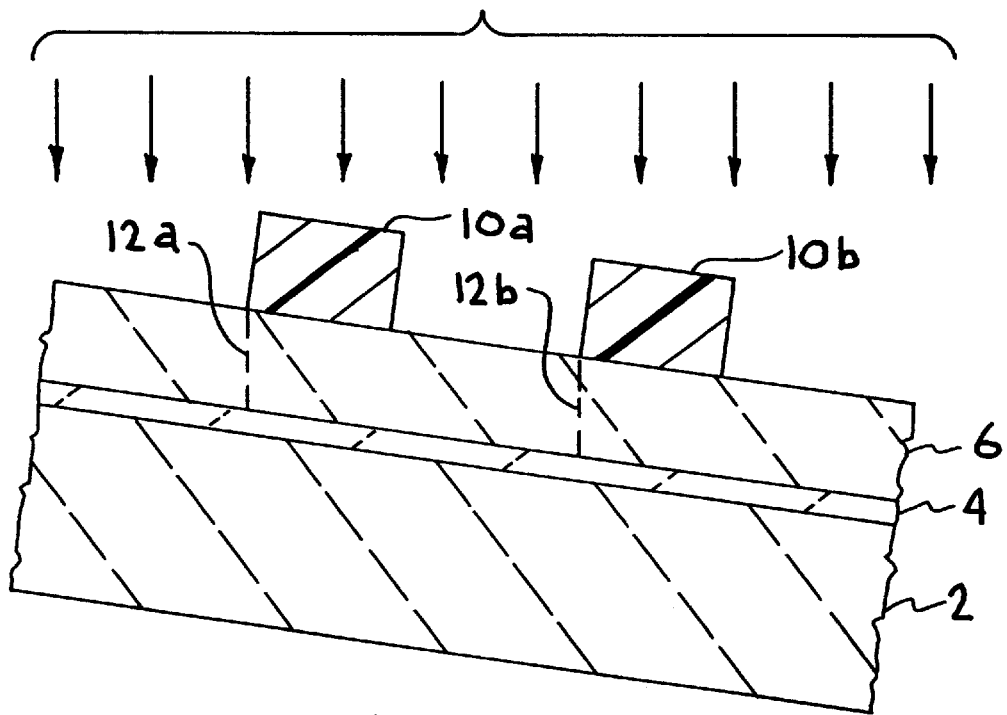
FIG. 3 is a fragmentary vertical side section view of a portion of FIG. 2 taken along lines III—III showing the substrate tilted with respect to the axis of the implantation beam to permit an implantation of the polysilicon layer which undercuts one side of the gate electrode mask.
Figure 4:
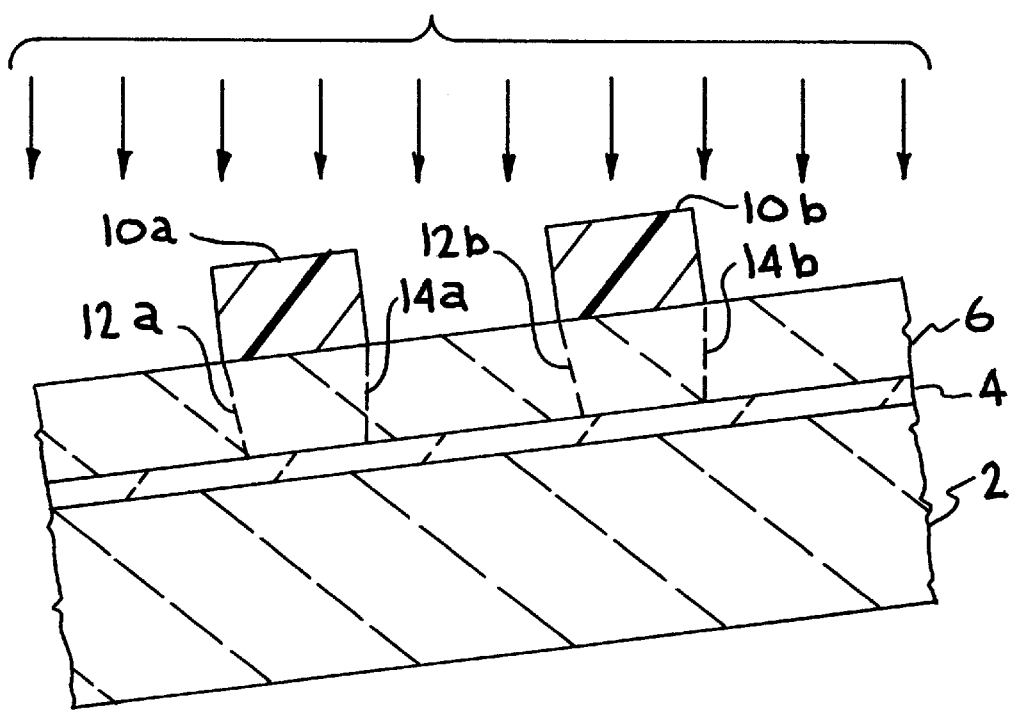
FIG. 4 is a fragmentary vertical side section view of the structure of FIG. 3 showing the substrate rotated 180° around the axis of the implantation beam and then again tilted with respect to the axis of the implantation beam to permit an implantation which undercuts the opposite side of the gate electrode mask.

The invention comprises a crystalline semiconductor gate electrode having a re-entrant geometry, as shown in FIG. 1. The novel gate electrode may be formed from a polysilicon layer on a substrate, which has previously been masked to form gate electrodes, extending, respectively, along both the X axis and Y axis lying in the polysilicon layer as shown in FIG. 2. The masked polysilicon layer is implanted with a neutral species, i.e., a species which will not introduce a dopant into the polysilicon, such as a Group IV element, e.g., silicon, or a Group VIII element, e.g., argon. The neutral species is implanted into the masked polysilicon layer at an angle to provide a tapered implanted region which undercuts one side of the length (long dimension) of the mask, as shown in FIG. 3. The substrate is then rotated 180° and then again implanted to provide a tapered implanted region which undercuts the opposite side of the length of the mask, as shown in FIG. 4. When gate electrodes with such re-entrant geometry are to be formed on a substrate with their long axes at right angles to one another, i.e., some lying along an X axis in the plane of the substrate and others lying along a Y axis in the plane of the substrate, as shown in FIG. 2, the substrate may be rotated 90°, rather than 180°, between each implantation, and four implantations, rather than two, are performed.

Figure 5:
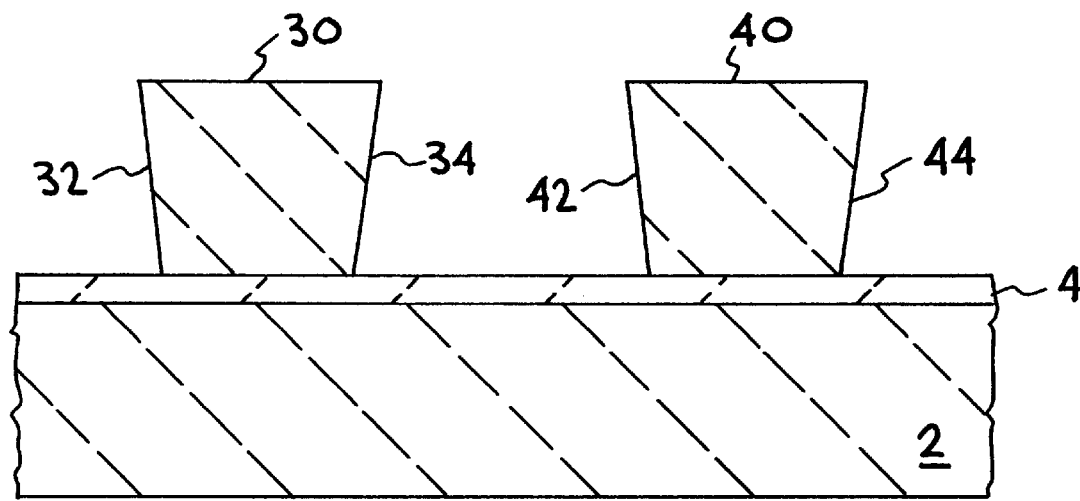
FIG. 5 is a fragmentary vertical side section view of the structure of FIG. 4 after an anisotropic etch of the polysilicon layer followed by removal of the gate electrode etch mask.

After the implantations, the implanted polysilicon layer is then subject to an etch, preferably an anisotropic etch, which will remove the unmasked implanted portions of the polysilicon layer, as well as the implanted regions beneath the mask, resulting in a gate electrode with re-entrant or tapered sidewalls, i.e., resembling an inverted trapezoid in cross-section, as shown in FIG. 5.

Referring now to FIG. 1, the re-entrant gate electrode of the invention is shown at 24 having sloped sidewalls 26 which are inwardly tapered as sidewalls 26 approach the underlying gate oxide 28. Such a re-entrant geometry for a gate electrode can be useful, for example, as a tapered mask for an implant to form a tapered gradient doped region in a substrate between the channel region beneath the gate electrode and the adjacent heavily doped source/drain region as a substitute for an LDD region to reduced high strength electric fields and resultant generation of hot carriers adjacent the gate oxide over the channel region of an MOS device. Such a structure and process for making such a tapered gradient doped region, using such a re-entrant gate electrode as a mask, is described in copending U.S. patent application Ser. No. 08/690,592, entitled "FORMATION OF GRADIENT DOPED PROFILE REGION BETWEEN CHANNEL REGION AND HEAVILY DOPED SOURCE/DRAIN CONTACT REGION OF MOS DEVICE IN INTEGRATED CIRCUIT STRUCTURE USING A RE-ENTRANT GATE ELECTRODE AND A HIGHER DOSE DRAIN IMPLANTATION", filed on Jul. 31, 1996, and assigned to the assignee of this invention, and the description of which is hereby incorporated by reference into this application.

While the extent of the slope, i.e., the angle of sloped sidewall 26 with respect to a line perpendicular to the underlying substrate surface, may vary widely, from a processing standpoint, the range of the angle will be dictated by the desired amount or extent of the taper of gate electrode 24 when it is functioning as a mask, based on the extent of dopant gradient and total width of the desired dopant gradient in the underlying substrate, i.e., the "gradient doped profile region" to be formed in the substrate. The angle of sloped sidewall 26 will also be effected by the desired ultimate performance or function of gate electrode 24 as a gate electrode for an MOS device or devices. In other words, while the slope angle of tapered sidewall 26 must define some minimum amount to obtain the desired dopant gradient in the substrate, the slope angle must also be limited by a maximum amount beyond which the width of gate electrode 24 and underlying gate oxide 28 in contact with the substrate will still define a gate electrode wide enough to be capable of carrying the desired amount of current for proper function of the intended MOS device to be constructed and which will define a channel region of sufficient width below it.

Therefore, in accordance with the invention, gate electrode 24 should have a taper angle, with respect to the vertical axis of the gate electrode, of from about 5° to about 30°, preferably from about 5° to about 10°, and typically about 6°. This angle is shown in FIG. 1 as angle α subtended between tapered sidewall 26 and a line 22 which is parallel to the vertical axis of gate electrode 24.

Referring now to FIG. 2, a portion of an integrated circuit structure is shown comprising a polysilicon layer 6 having gate electrode masks 10a, 10b, and 10c, which may comprise photoresist material, formed thereon. It will be noted that masks 10a and 10b are parallel to one another and are formed over that portion of polysilicon layer 6 overlying an opening (defined by dotted lines 8a) in an underlying field oxide isolation which exposes the substrate where MOS devices will be formed for which the portions of polysilicon layer 6 under masks 10a and 10b will form gate electrodes, as will be discussed below. Mask 10c, however, is oriented on polysilicon layer 6 at 90° to masks 10a and 10b, and defines a polysilicon gate electrode to be formed from polysilicon layer 6 at a right angle to the gate electrodes to be formed using masks 10a and 10b. In this connection, mask 10c lies over a second opening (shown by dotted lines 8b) formed in the underlying field oxide to expose the substrate where other MOS structures will be formed.

Turning now to FIG. 3, a vertical section of the structure of FIG. 2 is shown (at the section lines III—III shown in FIG. 2), with polysilicon layer 6 shown as formed over a gate oxide layer 4 formed over a silicon substrate 2. After formation of the gate electrode masks, such as illustrated masks 10a–10c, over polysilicon layer 6, the entire structure is mounted in an implanter and substrate 2 is then tilted, with respect to the implanter beam axis, sufficiently to define angle α between the beam axis and the vertical axis of the gate electrodes to be formed from polysilicon layer 6, i.e., the beam axis forms an angle α with a line perpendicular to the plane of polysilicon layer 6.

The doped polysilicon layer 6 is then implanted with either a group IV element, such as silicon, or a group VIII element, such as helium, neon, argon, krypton, etc. to thereby disrupt the crystallinity of doped polysilicon layer 6 in certain regions. The dosage used to damage polysilicon layer 6 in these regions, i.e., the minimum amount needed to obtain the desired degree of amorphousness, will be about $5 \times 10^{14}$ atoms of silicon per cm$^2$, or about $5 \times 10^{14}$ atoms of argon per cm$^2$. The implantation energy is based on the amount needed to fully implant to the depth of the polysilicon layer without, however, penetrating into the underlying gate oxide layer 4 or substrate 2 beneath gate oxide layer 4. As will be discussed below with respect to FIG. 6, preferably the implantation energy is sufficiently less than this maximum amount to minimize the risk of damage to the gate oxide or the underlying silicon substrate.

As shown in FIG. 3, this Group IV or Group VIII implantation enters the exposed portions of polysilicon layer 6, i.e., those portions of polysilicon layer 6 not covered by masks 10a and 10b as well as undercutting masks 10a and 10b, respectively at 12a and 12b.

Following this, the implanter is shut off and substrate 2 may be rotated 180° around the axis of the implanter beam and then again tilted again so that the beam axis forms an angle α with a line perpendicular to the plane of polysilicon layer 6 on gate oxide 4 and substrate 2. It should be noted that, as shown in FIG. 4, the substrate could be tilted through angle α in the opposite direction (without any rotation of the substrate), rather than returning the substrate to a horizontal position, rotating the substrate, and then again tilting it. However, it will probably be found to be easier to return the substrate to a horizontal position, rotate the substrate, and then again tilt the substrate in most cases, since (as shown in FIG. 2) most integrated circuit structures will have gate electrodes formed at right angles to one another, and hence after each implantation, the substrate will be rotated 90° (rather than 180°) followed by tilting and implantation.

In any event, the substrate is again implanted, using the same implantation parameters, which in the structure illustrated in FIG. 4, results in implantation of regions 14a and 14b beneath masks 10a and 10b. After the implantation steps which result in the undercutting of mask 10a at 12a and 14a, and mask 10b at 12b and 14b, implanted polysilicon layer 6 is subject to an anisotropic etch, such as Cl$_2$ plasma, which removes unmasked portions of polysilicon layer 6 as well as the undercut portions of polysilicon layer 6 beneath masks 10a and 10b at 12a, 14a, 12b, and 14b. The result is shown in FIG. 5 where re-entrant gate electrode 30 (representing the portion of polysilicon layer 6 beneath mask 10a) is shown with tapered sidewalls 32 and 34, and re-entrant gate electrode 40 (representing the portion of polysilicon layer 6 beneath mask 10b) is shown with tapered sidewalls 42 and 44.

As mentioned above, when the integrated circuit structure is to be formed with gate electrodes running lengthwise at 90° to one another, as depicted in FIG. 2, wherein gate electrode masks 10a and 10b are shown lying at 90° to mask 10c so that the resulting gate electrodes which will be formed from polysilicon layer 6 will be disposed at 90° to one another, the above described implantations will be carried out four times rather than two times, with each implantation carried out after rotating the substrate 90° around the implantation beam axis and resetting angle α.

Figure 6:
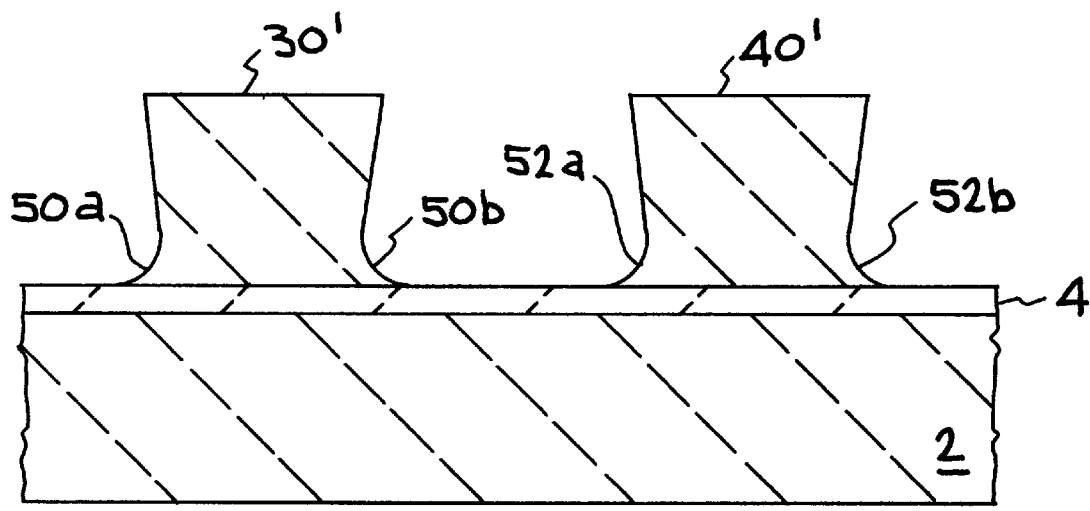
FIG. 6 is a fragmentary vertical side section view of another embodiment of the invention wherein the implantation peak is located at a level in the polysilicon layer spaced above the polysilicon/gate oxide interface to avoid damaging the gate oxide layer during the implantation step.

Referring now to FIG. 6, a preferred embodiment of the process of the invention is illustrated wherein the implantation energy is limited sufficiently to provide an implantation peak in polysilicon layer 6 which is spaced above the interface between polysilicon layer 6 and underlying gate oxide layer 4. As a result of this, the portion of polysilicon layer 6 just above gate oxide layer 4 is not as heavily implanted. Then when the anisotropic etch is carried out after the implantation steps, the portion of polysilicon layer 6 just above gate oxide layer 4, at least in the undercut regions beneath the gate electrode resist masks, will not be etched, leaving a "foot" remaining at the bottom of each of the re-entrant profiles or tapered sidewalls. Such "feet" are shown at 50a and 50b below the tapered sidewalls of re-entrant gate electrode 30' and at 52a and 52b below the tapered sidewalls of re-entrant gate electrode 40'. This may be found to be very valuable in preventing or inhibiting damage to those portions of gate oxide layer 4 which will remain beneath the gate electrodes, i.e., above the channel regions in the substrate, since damage to these portions of gate oxide layer 4 could have deleterious effects on the MOS transistors eventually formed using such re-entrant gate electrodes.

Thus, the invention provides a novel re-entrant polysilicon gate electrode and process for making same wherein the sidewalls of a polysilicon gate electrode may be formed with a taper extending inwardly at the lower portion or base of the polysilicon electrode adjacent the gate oxide to provide a gate electrode resembling, in cross-section, an inverted trapezoid by selectively implanting the polysilicon beneath the gate electrode mask at an angle to thereby undercut the mask so that the implanted polysilicon beneath the mask can be subsequently removed with the unmasked polysilicon in a subsequent etching step.

Having thus described the invention what is claimed is:

1. A process for forming a re-entrant polysilicon gate electrode over a substrate for an integrated circuit structure having a tapered sidewall extending to a narrowed base which comprises:
    a) selectively implanting a polysilicon layer beneath a gate electrode mask to promote undercutting of said mask during subsequent etching of said polysilicon layer to form said gate electrode; and
    b) then anisotropically etching said polysilicon layer to remove unmasked portions of said polysilicon layer and implanted portions of said polysilicon layer beneath said mask to form said re-entrant polysilicon gate electrode.

2. The process of claim 1 wherein said polysilicon layer beneath said mask is implanted by tilting said substrate and said polysilicon layer thereover with respect to the axis of an implantation beam used to implant said substrate.

3. The process of claim 2 wherein said polysilicon layer beneath said mask is implanted with an element selected from the group consisting of Group IV and Group VIII elements.

4. The process of claim 3 wherein said polysilicon layer beneath said mask is implanted with said element at a dosage level sufficient to change the crystalline state of the implanted portion of said polysilicon layer to an amorphous state.

5. The process of claim 4 wherein said polysilicon layer beneath said mask is implanted with an element selected from the group consisting of silicon and argon.

6. The process of claim 2 wherein said polysilicon layer beneath said mask is implanted by tilting said substrate and said polysilicon layer thereover with respect to the axis of an implantation beam used to implant said substrate an amount ranging from about 5° to about 30°.

7. The process of claim 4 wherein said polysilicon layer beneath said mask is implanted by tilting said substrate and said polysilicon layer thereover with respect to the axis of an implantation beam used to implant said substrate at an angle of about 6°.

8. The process of claim 4 wherein said polysilicon layer beneath said mask is implanted at an energy insufficient to damage said gate oxide layer beneath said polysilicon layer.

9. The process of claim 4 wherein said polysilicon layer beneath said mask is implanted with an element selected from the group consisting of Group IV and Group VIII elements at a dosage level sufficient to change the crystalline state of the implanted portion of said polysilicon layer to an amorphous state and at an energy level insufficient to damage said gate oxide layer beneath said polysilicon layer.

10. A process for forming a re-entrant polysilicon gate electrode over a substrate for an integrated circuit structure having a tapered sidewall extending to a narrowed base which comprises:
    a) tilting a substrate, having a polysilicon layer thereon with a gate electrode mask formed over said polysilicon layer, at an angle, with respect to the axis of an implantation beam, ranging from about 5° to about 30°;
    b) selectively implanting said polysilicon layer beneath said gate electrode mask with an element selected from the group consisting of Group IV and Group VIII elements and at a dosage level sufficient to change the crystalline state of the implanted portion of said polysilicon layer to an amorphous state to promote undercutting of said mask during subsequent etching of said polysilicon layer to form said gate electrode; and
    c) then anisotropically etching said polysilicon layer to remove unmasked portions of said polysilicon layer and implanted portions of said polysilicon layer beneath said mask to form said re-entrant polysilicon gate electrode.

11. A process for forming a re-entrant polysilicon gate electrode over a semiconductor substrate for an integrated circuit structure having a tapered sidewall extending to a narrowed base which comprises:
    a) forming a polysilicon gate electrode layer over a gate oxide layer on said semiconductor substrate;
    b) forming a gate electrode mask over said polysilicon layer;
    c) then selectively implanting said polysilicon layer beneath said gate electrode mask to promote undercutting of said mask at least adjacent said gate oxide layer during subsequent etching of said polysilicon layer to form said re-entrant polysilicon gate electrode; and d) then anisotropically etching said polysilicon layer to remove unmasked portions of said polysilicon layer and implanted portions of said polysilicon layer beneath said mask to form said re-entrant polysilicon gate electrode;

whereby a re-entrant polysilicon gate electrode may be formed with a taper extending inwardly at the lower portion or base of the polysilicon electrode adjacent the underlying gate oxide to provide a polysilicon gate electrode resembling, in cross-section, an inverted trapezoid.

12. A process for forming a re-entrant polysilicon gate electrode over a semiconductor substrate for an integrated circuit structure having a tapered sidewall extending to a narrowed base which comprises:

a) forming a gate oxide layer over said semiconductor substrate;

b) forming a polysilicon gate electrode layer over said gate oxide layer;

c) forming a gate electrode mask over said polysilicon layer on said substrate;

d) tilting said substrate and said polysilicon layer thereover, with respect to the axis of an implantation beam used to implant said substrate, an amount ranging from about 5° to about 30°;

e) then selectively implanting said polysilicon layer beneath said gate electrode mask with said implantation beam to promote formation of a gate electrode sidewall tapering inwardly from said mask to said oxide layer beneath said polysilicon layer during subsequent etching of said polysilicon layer to form said gate electrode; and f) then anisotropically etching said polysilicon layer to remove unmasked portions of said polysilicon layer and implanted portions of said polysilicon layer beneath said mask to form said tapered polysilicon gate electrode;

whereby a gate electrode may be formed with a taper extending inwardly at the lower portion or base of the polysilicon electrode adjacent the underlying gate oxide to provide a gate electrode resembling, in cross-section, an inverted trapezoid.

13. The process of claim 12 wherein said polysilicon layer beneath said mask is implanted by tilting said substrate and said polysilicon layer thereover with respect to the axis of an implantation beam used to implant said substrate an amount ranging from about 5° to about 10°.

\* \* \* \* \*